United States Patent
Hanicinec et al.

(10) Patent No.: US 12,100,619 B2
(45) Date of Patent: Sep. 24, 2024

(54) SEMICONDUCTOR WAFER DICING PROCESS

(71) Applicant: SPTS Technologies Limited, Newport (GB)

(72) Inventors: Martin Hanicinec, Newport (GB); Janet Hopkins, Newport (GB); Oliver Ansell, Newport (GB)

(73) Assignee: SPTS Technologies Limited, Newport (GB)

( * ) Notice: Subject to any disclaimer, the term of this patent is extended or adjusted under 35 U.S.C. 154(b) by 326 days.

(21) Appl. No.: 17/093,597

(22) Filed: Nov. 9, 2020

(65) Prior Publication Data

US 2021/0175122 A1    Jun. 10, 2021

(30) Foreign Application Priority Data

Dec. 9, 2019 (GB) .................................... 1917988

(51) Int. Cl.
*H01L 21/78* (2006.01)
*H01L 21/3065* (2006.01)
*H01L 21/67* (2006.01)

(52) U.S. Cl.
CPC .......... *H01L 21/78* (2013.01); *H01L 21/3065* (2013.01); *H01L 21/67069* (2013.01); *H01L 21/67092* (2013.01)

(58) Field of Classification Search
None
See application file for complete search history.

(56) References Cited

U.S. PATENT DOCUMENTS

| 7,906,410 | B2 | 3/2011 | Arita et al. |
| 7,994,026 | B2 | 8/2011 | Harikai et al. |
| 9,177,861 | B1 | 11/2015 | Park et al. |
| 9,281,224 | B2 | 3/2016 | Jost |
| 2003/0176069 | A1* | 9/2003 | Yuasa ............... H01L 21/78 438/692 |

(Continued)

FOREIGN PATENT DOCUMENTS

| EP | 1394851 A2 | 3/2004 |
| JP | 2006040914 A | 2/2006 |
| JP | 2018137483 A1 | 8/2018 |

OTHER PUBLICATIONS

IPO, Search Report for GB Application No. 1917988.6, Jun. 2, 2020.
EPO, ESR for EP20206602.3, Jun. 11, 2021.

*Primary Examiner* — Evren Seven
(74) *Attorney, Agent, or Firm* — Hodgson Russ LLP

(57) ABSTRACT

A semiconductor wafer dicing process is disclosed for dicing a wafer into individual dies, each die comprising one integrated circuit. The process comprises: disposing a coating upon the wafer; removing at least a portion of the coating to expose regions of the wafer, along which the wafer is to be diced, to form a workpiece; disposing the workpiece upon a platen within a processing chamber; plasma treating the workpiece with a set of plasma treatment conditions to etch a portion of the exposed regions of the wafer to form a wafer groove which extends laterally beneath the coating to form an undercut; and plasma etching the workpiece with a set of plasma etch conditions, which are different to the plasma treatment conditions, to etch through the wafer and dice the wafer along the wafer groove.

15 Claims, 7 Drawing Sheets

(56) References Cited

U.S. PATENT DOCUMENTS

| | | | |
|---|---|---|---|
| 2005/0136682 A1* | 6/2005 | Hudson | H01L 21/31116 438/714 |
| 2005/0287815 A1* | 12/2005 | Lai | H01L 21/30655 156/345.1 |
| 2006/0024924 A1* | 2/2006 | Haji | H01L 21/6836 438/464 |
| 2007/0120255 A1* | 5/2007 | Oyu | H01L 29/0657 257/E29.022 |
| 2009/0057838 A1* | 3/2009 | Arita | H01L 21/31138 257/618 |
| 2014/0213041 A1 | 7/2014 | Lei et al. | |
| 2017/0229366 A1* | 8/2017 | Harikai | H01L 21/6835 |
| 2017/0229384 A1* | 8/2017 | Harikai | H01L 21/3065 |
| 2017/0263524 A1* | 9/2017 | Mizuno | H01L 21/311 |
| 2017/0263525 A1 | 9/2017 | Mizuno et al. | |
| 2017/0263526 A1 | 9/2017 | Mizuno et al. | |
| 2018/0240678 A1 | 8/2018 | Tou et al. | |

\* cited by examiner

SEMICONDUCTOR WAFER DICING PROCESS

CROSS-REFERENCE TO RELATED APPLICATIONS

This application claims priority to UK Patent Application No. 1917988.6 filed Dec. 9, 2019, the disclosure of which is hereby incorporated by reference.

FIELD OF THE DISCLOSURE

The present invention is related to a semiconductor wafer dicing process.

BACKGROUND OF THE DISCLOSURE

Following the manufacture of semiconductor or microelectro-mechanical system (MEMS) devices on a semiconductor wafer, a wafer dicing or scribing step is required to segment the wafer into individual chips or die. Prior to the wafer dicing step the wafers are attached to a support film, in order to support the discrete die post dicing step, which is in turn attached to an annular support frame. Once the dicing operation has been completed, individual die can be removed from the support film and be tested and incorporated into packaged devices.

The dicing of semiconductor wafers can be achieved by mechanical scribing, sawing, laser scribing, plasma etching or a combination of these techniques However, it is found that both scribing or sawing of wafers can cause chips and gouges to form along the edges of the separate die. In addition, cracks can form and propagate from the edges of the die into the substrate and render the integrated circuitry disposed thereon inoperative. The problem of chipping and crack propagation requires additional spacing between the die on the wafer to prevent damage to the integrated circuits. The increased spacing requirement effectively reduces the wafer real estate for circuitry.

A more recent approach to the dicing of semiconductor wafers makes use of a plasma to etch the wafer along the streets. Plasma dicing is found to provide a reduced damage to the edges of the die and a narrower cut can be achieved which therefore provides for a more closely packed arrangement of die upon the wafer. Furthermore, plasma dicing enables different shapes and layouts of die to be fabricated that cannot be achieved with mechanical scribing.

The dicing of the wafer using a plasma requires the wafer to be initially coated with a photoresist or similar mask in order to define the dicing pattern. This can be achieved by conventional photolithographic steps or by applying a continuous polymer coating upon the wafer and then using a laser beam to pattern the polymer coating with the appropriate scribe lines to expose the regions of the wafer to be etched. The laser groove process has the benefit that any debris or metal structures in the street regions of the wafer, which would be problematic for the plasma etch process, are ablated by the beam. However, it is found that the laser beam ablation of the coating also removes a portion of the substrate creating a channel therein which reduces the mechanical integrity of the die.

Moreover, it is found that when patterning the coating with a laser, the street regions of the wafer develop a rough edge surface. This surface roughness promotes non-conformity along the side walls during the plasma etching process, which again reduces the mechanical integrity of the die.

We have now devised an improved semiconductor wafer dicing process which alleviates at least some of the above mentioned problems.

BRIEF SUMMARY OF THE DISCLOSURE

In accordance with an aspect of the present invention, there is provided a semiconductor wafer dicing process for dicing a wafer into individual dies, each die comprising one integrated circuit, the process comprising: disposing a coating upon the wafer; removing at least a portion of the coating to expose regions of the wafer, along which the wafer is to be diced, to form a workpiece; disposing the workpiece upon a platen within a processing chamber; plasma treating the workpiece with a set of plasma treatment conditions to etch a portion of the exposed regions of the wafer to form a wafer groove which extends laterally beneath the coating to form an undercut; and plasma etching the workpiece with a set of plasma etch conditions to etch through the wafer and dice the wafer along the wafer groove.

In an embodiment, the at least a portion of the coating is removed using photolithographic techniques to form a patterned coating. Alternatively, the at least a portion of the coating is removed using a laser beam which is scanned across a surface of the wafer to form a patterned coating.

In an embodiment, the etching of the wafer with the plasma treatment conditions comprises a substantially isotropic etching of the wafer.

In an embodiment, the workpiece is disposed upon an adhesive tape and the process further comprises mounting the workpiece disposed upon the tape, upon a wafer frame, prior to the plasma treatment step.

In an embodiment, the plasma treatment conditions comprise passing an etching gas through the process chamber with a flow rate in the range 50-300 sccm.

In an embodiment, the plasma treatment conditions comprise or further comprise maintaining a pressure within the process chamber in the range of 10-80 mT.

In an embodiment, the plasma treatment conditions comprise or further comprise electrically biasing the platen with an electrical power in the range 100-1000 W.

In an embodiment, the plasma treatment conditions comprise or further comprise maintaining a plasma within the chamber for a duration of 10-60 seconds.

In an embodiment, the plasma treatment conditions comprise or further comprise providing electrical power to a coil associated with a plasma generating arrangement, in the range 1000-3000 W.

In an embodiment, the undercut extends approximately 3-7 µm beneath the coating.

In an embodiment, the plasma treatment of the workpiece and the plasma etching of the workpiece is performed within the same process chamber.

In an embodiment, the plasma etching of the workpiece is performed directly after the plasma treating of the workpiece.

In accordance with a second aspect of the present invention there is provided a system configured to perform the semiconductor dicing process of the first aspect.

Whilst the invention has been described above, it extends to any inventive combination of features set out above or in the following description. Although illustrative embodiments of the invention are described in detail herein with reference to the accompanying drawings, it is to be understood that the invention is not limited to these precise embodiments.

Furthermore, it is contemplated that a particular feature described either individually or as part of an embodiment can be combined with other individually described features, or parts of other embodiments, even if the other features and embodiments make no mention of the particular feature. Thus, the invention extends to such specific combinations not already described.

DESCRIPTION OF THE DRAWINGS

The invention may be performed in various ways, and, by way of example only, embodiments thereof will now be described with reference to the accompanying drawings, in which.

DETAILED DESCRIPTION OF THE DISCLOSURE

Figure 1:
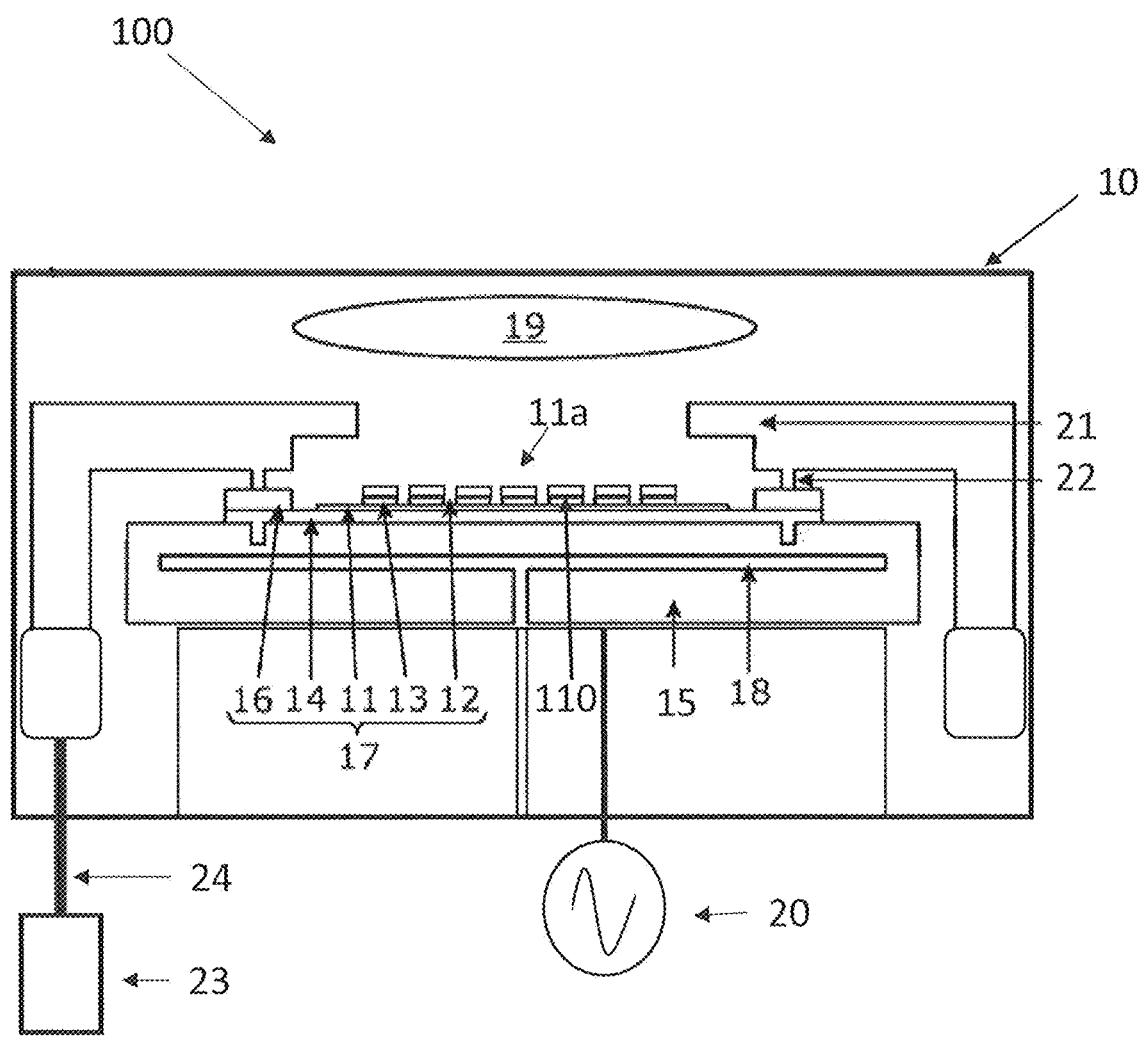
FIG. 1 is a schematic representation of a system for dicing semiconductor wafers according to an embodiment of the present invention.

Referring to the FIG. 1 of the drawings, there is illustrated a system 100 configured to implement the steps associated with a process for plasma dicing a semiconductor wafer according to an embodiment of the present invention.

The system 100 comprises a processing chamber 10 within which is disposed a substrate or wafer 11 for processing. The wafer 11 comprises a plurality of integrated circuits 13 which are separated by street regions 12. The wafer 11 is disposed upon an adhesive tape, namely dicing tape 14, which is itself secured to a frame 16, such as an annular frame. The tape 14 and frame 16 collectively form a frame assembly 17 which is disposed upon an a platen or electrostatic chuck 15.

The dicing tape 14 is typically composed of polyolefin, poly(vinyl chloride), or poly(ethylene terephthalate). The annular frame 16 is typically composed of stainless steel or plastic and the surface area of the frame assembly 17 and the electrostatic chuck 15 are selected so that the electrostatic chuck 15 extends beyond the diameter of the annular frame 16 and contains internal cooling channels 18 where a coolant gas is passed. A high voltage may be applied to the electrostatic chuck 15 via an RF supply (not shown). The electrostatic clamping mechanism enables a good thermal contact to exist between the frame assembly 17 and the electrostatic chuck 15. A good thermal contact between the frame assembly 17 and the electrostatic chuck 15 helps to keep the frame assembly 17 cool during plasma treatment and prevent thermal degradation of the dicing tape 14.

The annular frame 16 and exposed tape 14 is shielded from direct exposure to the plasma 19 by use of a frame cover 21. The frame cover 21 can be positioned to make contact with the frame 16 (as shown at 22 in FIG. 1) or raised through the use of an actuator 23 and the associated lift connector 24. An RF supply 20, typically operating at 13.56 MHz, is made to the platen/electrostatic chuck 15 to provide a bias voltage to the wafer 11. Standard techniques for introducing process gas into and from the chamber 10 are employed.

Figure 2:
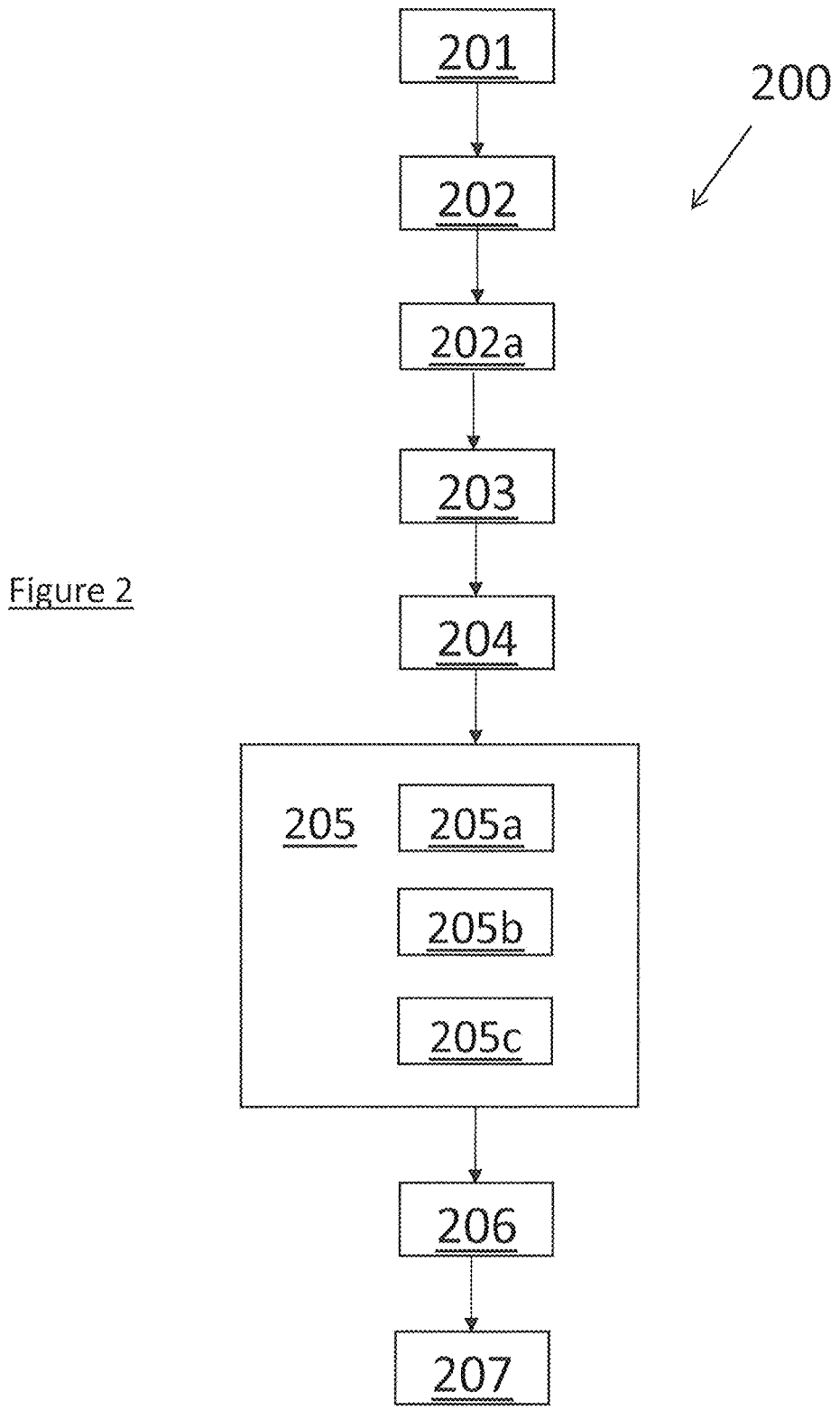
FIG. 2 is a flowchart sequencing the steps associated with a semiconductor wafer dicing process according to a first embodiment of the present invention.

The process plasma is shown schematically at 19 and it is to be appreciated that this plasma may be generated using different techniques, including but not limited to an inductive coupling technique whereby electromagnetic energy is inductively coupled within the chamber 10 via a coil (not shown) disposed around the chamber 10. Referring to FIG. 2 of the drawings, there is illustrated a flow chart sequencing the steps associated with a semiconductor wafer dicing process 200 according to an embodiment of the present invention. The semiconductor wafer 11 is first coated with a coating 110, such as a water soluble polymer coating, at step 201. This may be achieved by spin coating or spray coating of the polymer upon the wafer 11 to achieve a uniform coating thickness. The wafer 11 is then subject to a scribing operation at step 202, whereby the regions of the coating 110 which are disposed adjacent the wafer streets 12, namely the regions between the integrated circuits 13, are removed. In an embodiment, this removal is achieved using a laser (not shown). A laser beam is focused upon the coating using a lens and beam steering arrangement (not shown) and the laser beam is scanned across the coated wafer 11 at step 202a to scribe the desired pattern within the coating and thus expose an upper surface of the wafer 11, to create a work-piece 11a for processing. Alternatively, the wafer 11 may be coated with a photoresist at step 201 which is patterned using photolithographic techniques at step 202a to expose the street regions 12 of the wafer 11 and thus form the workpiece 11a.

The workpiece 11a is subsequently disposed upon an adhesive tape 14 at step 203, which is itself disposed upon a frame 16, such as an annular frame, to provide mechanical support to the workpiece 11a. Alternatively, the laser scribing step can occur following the mounting of the semiconductor substrate 11 on the tape 14. The adhesive tape 14 or backing tape serves to hold the workpiece 11a in place relative to the frame 16, so that it can be suitably aligned, and also secures the dies following the dicing process, so that they can be easily manipulated.

The framed workpiece 11a is subsequently loaded into the processing chamber 10 at step 204 and disposed upon the electrostatic chuck 15. The workpiece 11a is then subject to a plasma treatment step at step 205 comprising a set of plasma treatment conditions. A fluorine containing etching gas, such as $SF_6$ is introduced into the chamber at step 205a, possibly with other gases including $O_2$ and Ar (to aid with the removal of materials). A controller (not shown) regulates the flow rate through the chamber in the range of 50-300 sccm, and typically 200 sccm, and maintains a pressure within the chamber in the range 10-80 mT, typically 35 mT. The coils (not shown) associated with the plasma generating arrangement are then supplied with an electrical power in the range 1000-3000 W, typically 2500 W, at step 205b to generate a plasma 19 and an electrical bias is applied to the workpiece 11a via the electrostatic chuck 15 via an electrical generator 20 at step 205c. The chuck 15 is supplied with electrical power in the range 100-1000 W, typically 500 W, and the electrical bias facilitates the interaction between the plasma species and the exposed wafer regions to plasma etch the exposed regions of the wafer 11. The isotropic nature of the etching of the fluorine forms an undercut beneath the coating 110 within the street regions 12 of the wafer 11, cleans any debris in the street regions 12 and improves the quality of sidewall for the subsequent step of plasma dicing of the wafer 11. The plasma treatment step 205 is found to improve the subsequent dicing of the wafer 11, regardless of whether the wafer 11 comprises a coating 110 which has been patterned by a laser or a mask that has been patterned using photolithographic techniques, by providing an improved side wall quality to the resulting die and also by reducing stress points within the die.

Traditionally applied etching methods introduce Ar and $SF_6$ gas into the process chamber 10 with a high bias applied to the chuck 15, which results in an extended etch to a large depth within the wafer 11. The aim of the plasma treatment step 205 is to etch the wafer 11 laterally rather than vertically by applying a reduced bias over a short process time, in order to control the amount of undercut beneath the coating 110.

Figure 3:
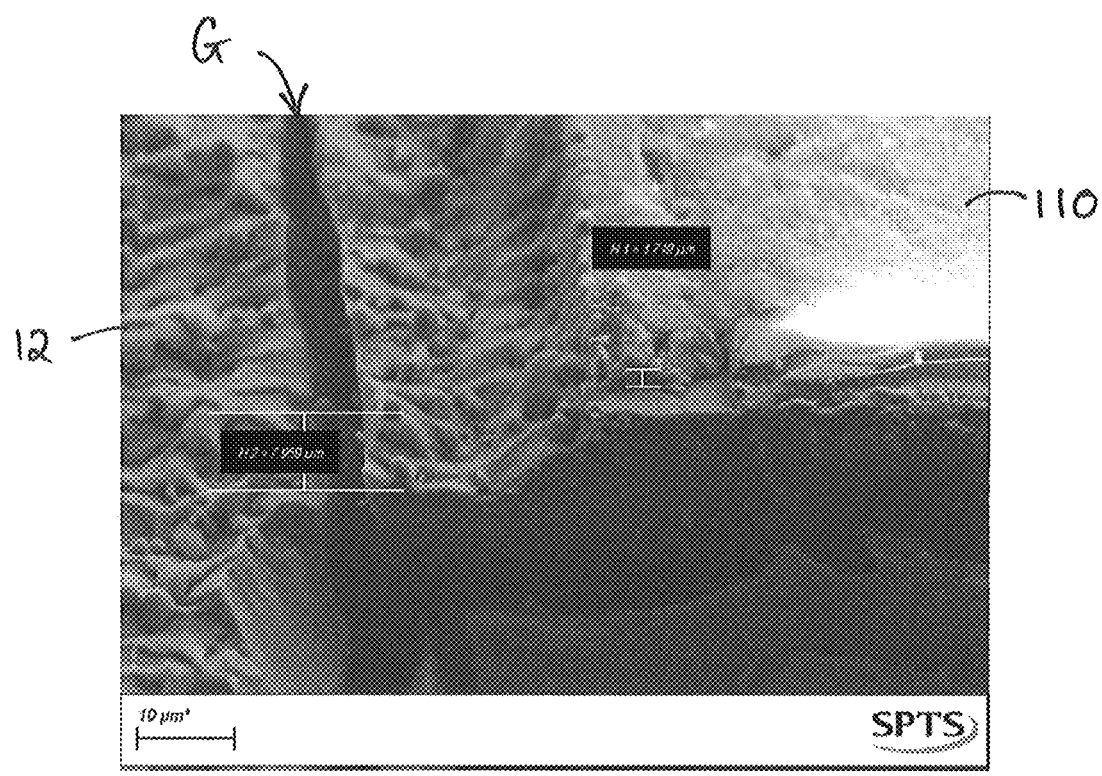
FIG. 3 is a SEM image illustrating the groove formed in the surface of the wafer following a laser removal of the coating.
Figure 4:
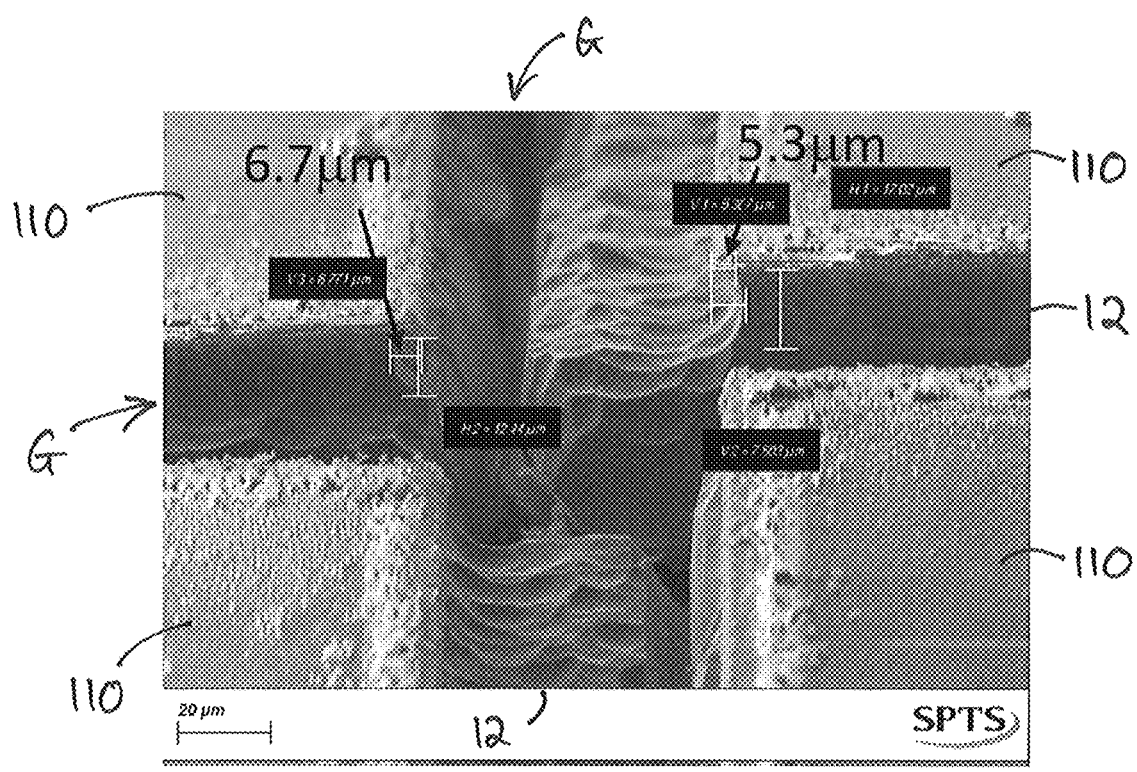
FIG. 4 is a SEM image illustrating the groove formed in the surface of a wafer following a laser removal of a coating and a subsequent plasma treatment step.
Figure 5:
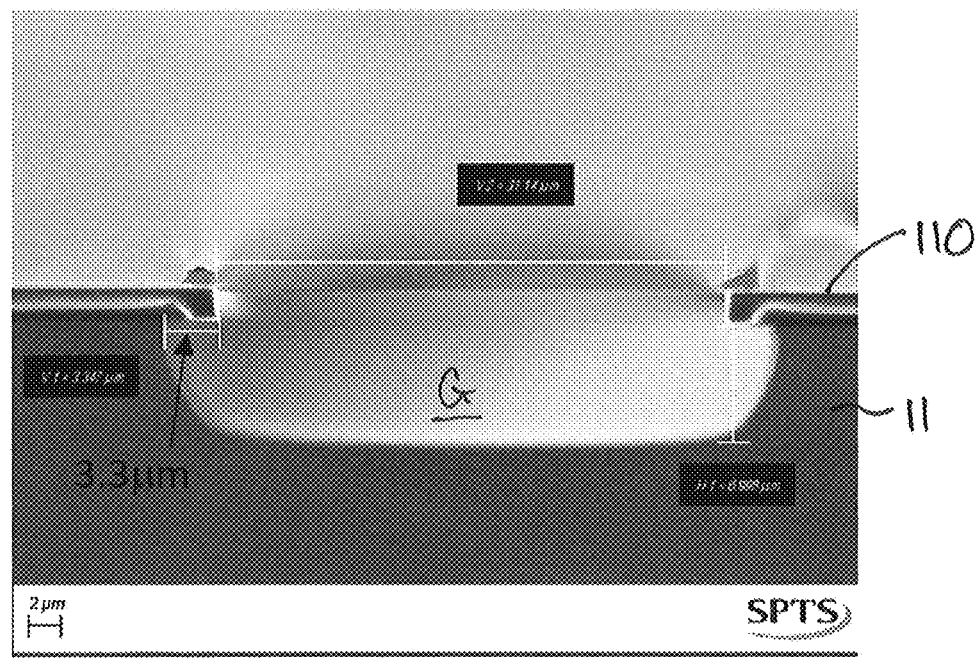
FIG. 5 is a SEM image of a cross-section through a wafer comprising a photoresist mask, which has been subject to a plasma treatment step for approximately 30 seconds.
Figure 6:
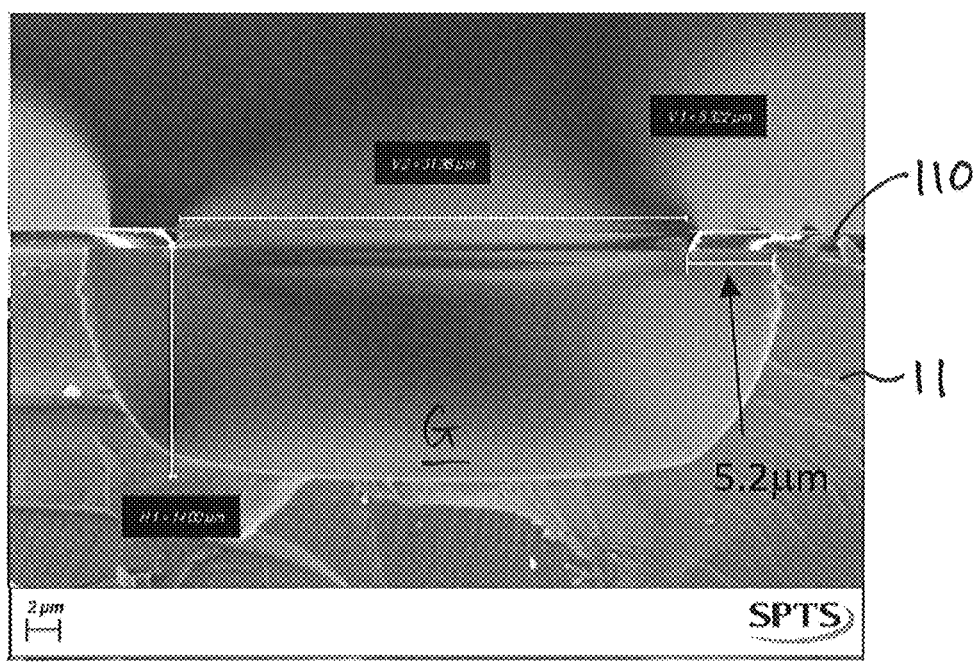
FIG. 6 is a SEM image of a cross-section through a wafer comprising a photoresist mask, which has been subject to a plasma treatment step for approximately 60 seconds.
Figure 8:
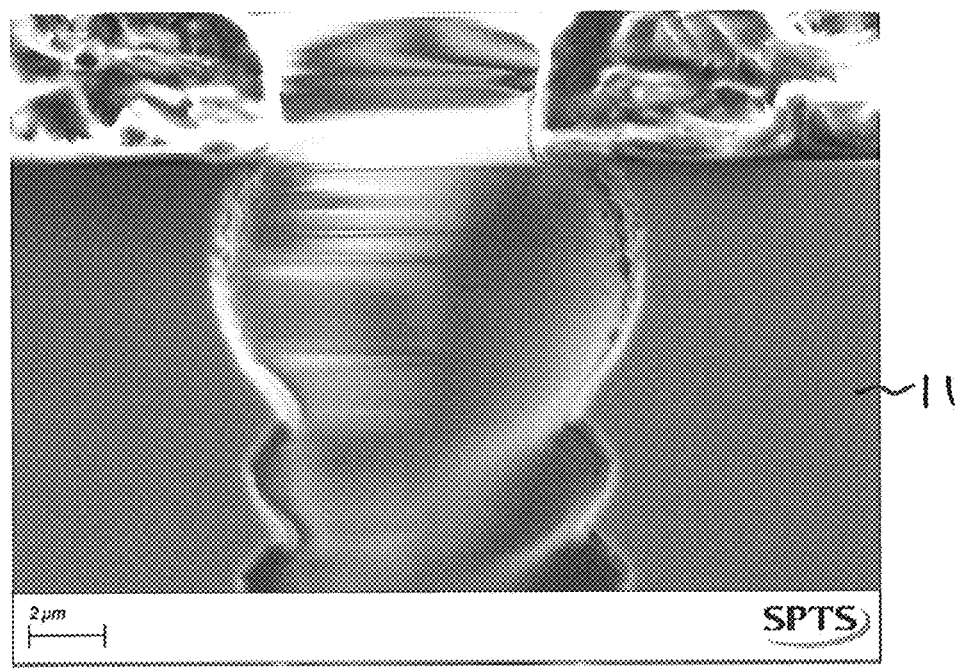
FIG. 8 is a SEM image of a cross-sectional view through a wafer comprising a laser grooved mask that has been diced using a plasma etching, following a plasma treatment step.

In an embodiment, the plasma associated with the plasma treatment step 205 is maintained for a duration of 10-60 seconds, and typically 30 seconds in order to form an undercut beneath the coating 110 within the street region 12 of the wafer 11. FIG. 3 illustrates the groove G formed in the surface of the wafer 11 comprising a laser grooved coating, and FIG. 4 illustrates the improved side wall quality of the groove G with the associated undercut, following the plasma treatment step. FIG. 8 illustrates an undercut of approximately 5-7 μm following a 60 second duration plasma treatment step. FIGS. 5 and 6 demonstrate the similar undercut formed within a wafer 11 comprising a photoresist mask, which has been subject to a plasma treatment step 205 for approximately 30 seconds and 60 seconds, respectively.

Following the plasma treatment step 205, the plasma dicing operation 206 is performed using a set of plasma etching conditions, which are typically different to the plasma treatment conditions. The plasma etching of the workpiece 11a is typically performed in the same process chamber 10 that the plasma treatment step is performed, and preferably directly after the plasma treatment step. Once the wafer 11 has been diced, the coating 110 disposed upon the dies are then removed at step 207.

Figure 7:
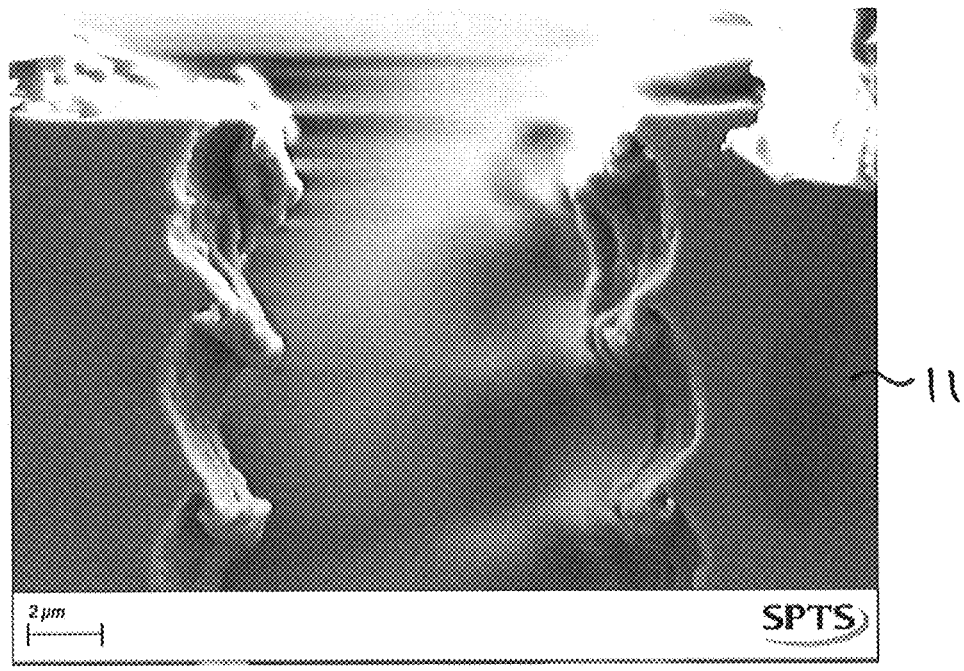
FIG. 7 is a SEM image of a cross-sectional view through a wafer comprising a laser grooved mask that has been diced using a plasma etching, without a plasma treatment step.
Figure 9:
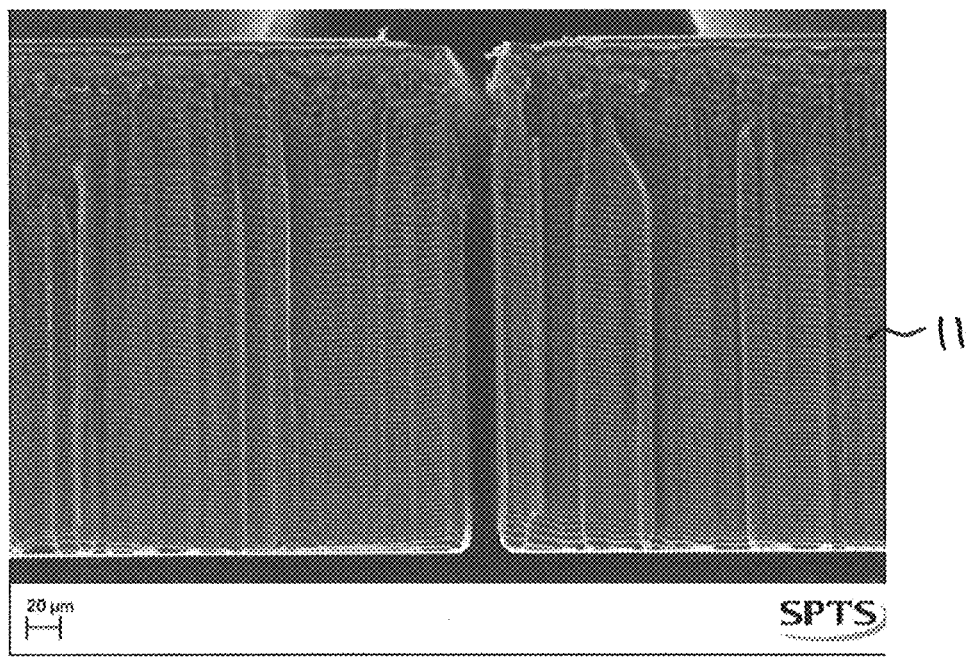
FIG. 9 is a SEM image of a cross-section through a wafer that has been diced using a plasma etching, but which has not been subject to a prior plasma treatment step.
Figure 10:
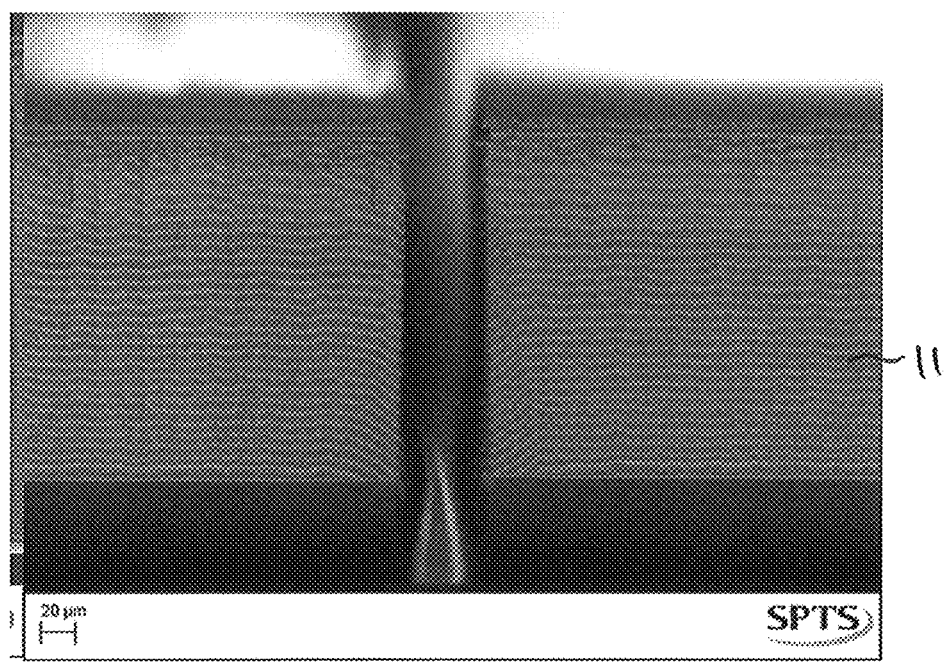
FIG. 10 is a SEM image of a cross-section through a wafer that has been diced using a plasma etching, following a plasma treatment step.
Figure 11:
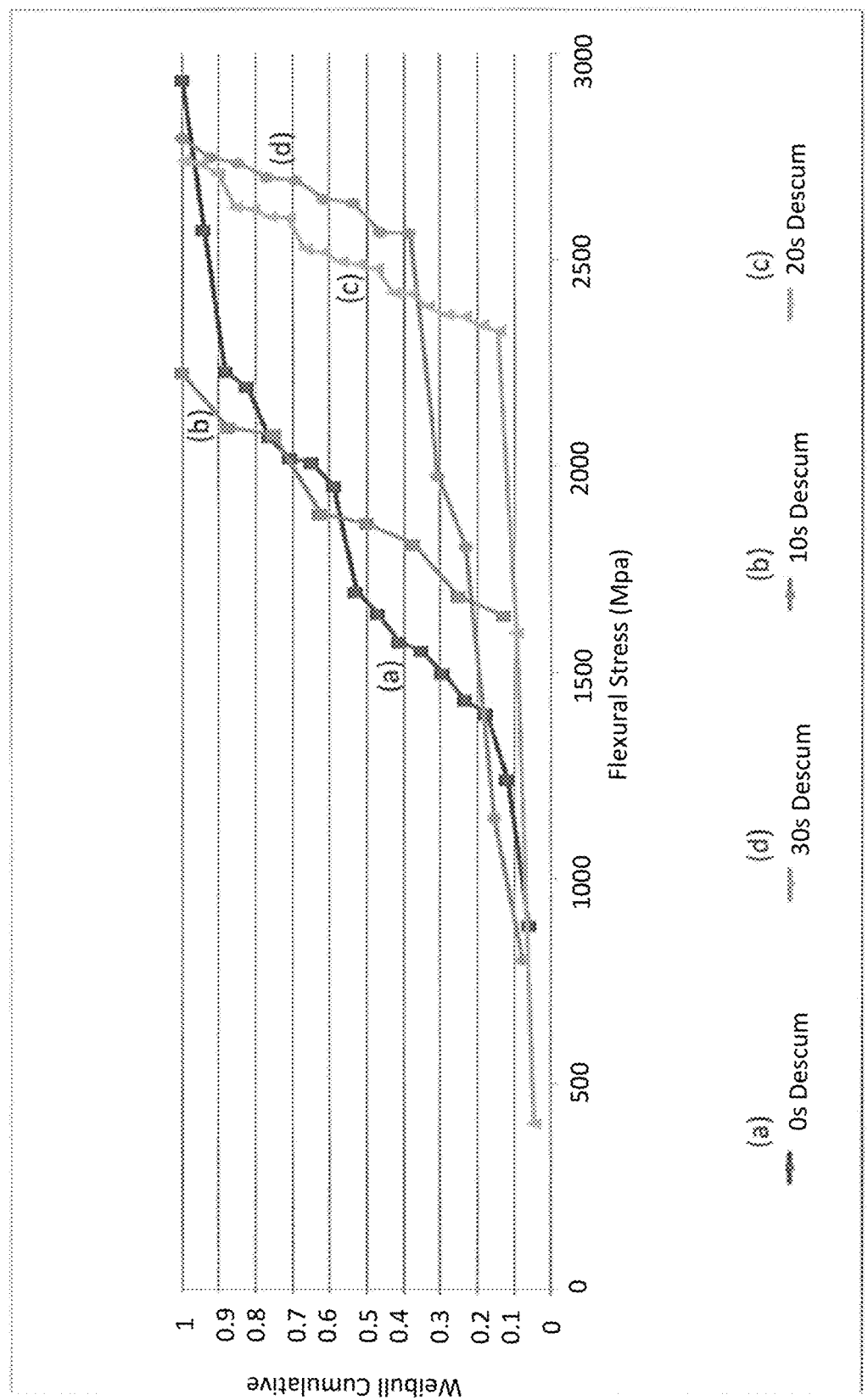
FIG. 11 is a graphical representation of the die strength for photolithographic generated masked wafers which are subject to a plasma treatment step for a duration of (a) 0 seconds, (b) 10 seconds, (c) 20 seconds and (d) 30 seconds, prior to wafer dicing.

Referring to FIG. 7 of the drawings, there is illustrated a magnified SEM image of a cross-section through a wafer 11 that has been prepared using a laser scribing process, and then diced using a plasma etching process. FIG. 8 is a magnified SEM image of a cross-section through a similar wafer 11 that has been prepared using a laser scribing process, but then subject to the above plasma treatment step 205 prior to dicing using a plasma etching process 206. The improvement in the side wall quality of the wafer 11 illustrated in FIG. 8 compared with the side wall of the wafer 11 in FIG. 11 is clearly evident. FIG. 8 clearly illustrates a smooth contour to the side wall compared with that shown in FIG. 7. Referring to FIG. 9 of the drawings, there is provided a SEM image of a cross-section through a wafer 11 that has been diced using a plasma etching, but which has not been subject to a prior plasma treatment step 205, whereas FIG. 10 is an SEM image of a similar wafer 11 which has been plasma diced following a plasma treatment step 205. The striations in the wafer 11 and the improved side wall quality associated with the wafer 11 subject to the plasma treatment step 205 (FIG. 10) is clearly evident.

Referring to FIG. 11 of the drawings, there is provided a Weibull cumulative probability distribution of die flexural strength (x-axis) of dies formed from a wafer 11 that has been coated with a photoresist mask, and which has been subject to varying durations of the plasma treatment step. Curve (a) represents the flexural strength of a die that has not undergone any plasma treatment prior to plasma dicing, whereas curves (b), (c) and (d) represent the flexural strength of the dies which have undergone a plasma treatment for a duration of 10 seconds, 20 seconds and 30 seconds, respectively. It is clear from FIG. 11 that an increased plasma treatment duration provides for an increased strength associated with the die. Similar benefits are also observed for wafers comprising a laser grooved coating.

While it is known that plasma dicing can improve the mechanical properties of the die when compared to conventional scribing techniques, due to the damage caused by these methods, it is surprising that plasma dicing can also improve the mechanical integrity of wafers with a photolithographic mask. The photolithographic mask should have no impact on the silicon below, unlike the scribing or saw methods. Without being bound by any theory or conjecture it is proposed that the undercut region reduces stress at top edge of the die. This in turn reduces the likelihood of crack propagation.

What is claimed is:

1. A semiconductor wafer dicing process for dicing a wafer into individual dies, each die comprising one integrated circuit, the process comprising:
    disposing a coating upon a first side of the wafer, wherein the wafer includes the first side and a second side, and wherein the wafer is silicon;
    removing at least a portion of the coating to expose regions of the first side of the wafer, along which the wafer is to be diced, to form a workpiece;
    disposing the workpiece upon a platen within a processing chamber with the second side of the wafer disposed adjacent the platen;
    plasma treating the workpiece with a set of plasma treatment conditions to etch a portion of the exposed regions of the wafer to form a wafer groove which extends laterally beneath the coating to form an undercut that is concave, wherein the plasma treating of the wafer with the plasma treatment conditions comprises a substantially isotropic etching of the wafer using a fluorine containing etch gas, oxygen, and argon, and wherein the undercut extends approximately 3-7 μm beneath the coating; and
    plasma etching the workpiece with a set of plasma etch conditions to etch through the wafer and dice the wafer along the wafer groove.

2. The semiconductor wafer dicing process according to claim 1, wherein the at least a portion of the coating is removed using photolithographic techniques to form a patterned coating.

3. The semiconductor wafer dicing process according to claim 1, wherein the at least a portion of the coating is removed using a laser beam which is scanned across a surface of the wafer to form a patterned coating.

4. The semiconductor wafer dicing process according to claim 1, further comprising disposing the workpiece upon an adhesive tape and mounting the workpiece disposed upon the tape, upon a wafer frame, prior to the plasma treating.

5. The semiconductor wafer dicing process according to claim 1, wherein the plasma treatment conditions comprise passing an etching gas through the processing chamber with a flow rate in the range 50-300 sccm.

6. The semiconductor wafer dicing process according to claim 1, wherein the plasma treatment conditions comprise maintaining a pressure within the processing chamber in the range of 10-80 mT.

7. The semiconductor wafer dicing process according to claim 1, wherein the plasma treatment conditions comprise electrically biasing the platen with an electrical power in the range 100-1000 W.

8. The semiconductor wafer dicing process according to claim 1, wherein the plasma treatment conditions comprise maintaining a plasma within the processing chamber for a duration of 10-60 seconds.

9. The semiconductor wafer dicing process according to claim 1, wherein the plasma treatment conditions comprise providing electrical power to a coil associated with a plasma generating arrangement in the range 1000-3000 W.

10. The semiconductor wafer dicing process according to claim 1, wherein the plasma treatment of the workpiece and the plasma etching of the workpiece are performed within the same processing chamber.

11. The semiconductor wafer dicing process according to claim 1, wherein the plasma etching of the workpiece is performed directly after the plasma treating of the workpiece.

12. The semiconductor wafer dicing process according to claim 1, further comprising removing the coating from the plasma diced wafer.

13. A system configured to perform the semiconductor wafer dicing process according to claim 1.

14. The semiconductor wafer dicing process according to claim 1, wherein the undercut extends approximately 5-7 µm beneath the coating.

15. The semiconductor wafer dicing process according to claim 1, wherein the set of plasma etch conditions are different from the set of plasma treatment conditions.

* * * * *